United States Patent

[11] 3,577,046

| | | |
|---|---|---|
| [72] | Inventor | **Joseph Moyson** **Union Springs, N.Y.** |
| [21] | Appl. No. | **809,076** |
| [22] | Filed | **Mar. 21, 1969** |
| [45] | Patented | **May 4, 1971** |
| [73] | Assignee | **General Electric Company** **Continuation-in-part of application Ser. No. 741,675, July 1, 1968, now abandoned.** |

[54] MONOLITHIC COMPOUND THYRISTOR WITH A PILOT PORTION HAVING A METALLIC ELECTRODE WITH FINGER PORTIONS FORMED THEREON
3 Claims, 5 Drawing Figs.

[52] U.S. Cl. .......... 317/235R, 317/234R, 317/234N, 317/235AA, 317/235AB, 317/235AE

[51] Int. Cl. .......... H01l 11/00, H01l 15/00

[50] Field of Search .......... 317/234, 235, 41, 41.1, 40, 5.4, 44

[56] References Cited

UNITED STATES PATENTS

| | | | |
|---|---|---|---|
| 3,124,703 | 3/1964 | Sylvan .......... | 317/235 |
| 3,210,621 | 10/1965 | Strull .......... | 317/235 |
| 3,274,458 | 9/1966 | Boyer et al .......... | 317/235 |
| 3,476,989 | 11/1969 | Miles et al. .......... | 317/235 |
| 3,486,088 | 12/1969 | Gray et al. .......... | 317/235 |
| 3,526,815 | 9/1970 | Svedberg et al. .......... | 317/234X |

FOREIGN PATENTS

| | | | |
|---|---|---|---|
| 935,710 | 9/1963 | Great Britain .......... | 317/235 |

*Primary Examiner*—John W. Huckert
*Assistant Examiner*—Andrew J. James
*Attorneys*—Robert J. Mooney, Nathan J. Cornfeld, Carl O. Thomas, Frank L. Neuhauser, Oscar B. Waddell and Joseph B. Forman

ABSTRACT: A silicon-controlled rectifier or thyristor is provided having a control signal responsive pilot portion functionally separated from, though structurally monolithic with, a main current carrying portion. Turning on of the pilot portion is controlled by a gate or control signal and the resulting pilot current through the pilot portion provides a high energy turn-on signal for the main portion, thereby enabling optimum turn-on efficiency to be designed into the pilot portion while preserving high current carrying capacity in the main portion, with resulting high *di/dt* and *dv/dt*. The turn-on signal from the pilot thyristor may be distributed over a wide area of the main thyristor.

INVENTOR:
JOSEPH MOYSON,

BY Carl O. Thomas

MONOLITHIC COMPOUND THYRISTOR WITH A PILOT PORTION HAVING A METALLIC ELECTRODE WITH FINGER PORTIONS FORMED THEREON

This invention is a continuation-in-part of my copending application, Ser. No. 741,675, filed July 1, 1968 and now abandoned. My invention relates generally to solid-state electric current switches of the multilayer semiconductor type, known in the art as thyristors, and more particularly it relates to improved monolithic compound semiconductor thyristors particularly suitable for high power switching applications.

Semiconductor thyristors of conventional design and construction are well known in the art, and the general theory of operation of such devices has been described in various publications, for example "Proceedings of the IRE," Sept. 1956, Vol. 44, pages 1174 to 1182, the "General Electric SCR Manual," 4th Edition, Copyright 1967 by the General Electric Company and "Semiconductor Controlled Rectifiers," Copyright 1964 by Prentice-Hall, Inc. In one form such a thyristor device includes a semiconductor body which is sandwiched between two main current carrying electrodes, usually called the anode and cathode electrodes, and is provided with a control or gate electrode. When connected in series with a load impedance and a source of forward bias voltage a thyristor will ordinarily block appreciable current flow between its anode and cathode electrodes until a control current of relatively small but sufficient magnitude and duration is supplied to its control electrode whereupon it abruptly switches from a high impedance to a very low impedance forward-current conducting, or turned-on, state.

The semiconductor body of such a device is monocrystalline and usually of disclike shape having four distinct layers or regions with adjacent layers being of opposite conductivity type to form a plurality of PN junctions. The anode and cathode electrodes are connected in low resistance nonrectifying contact to the respective two outside layers and the gate electrode is connected to one of the intermediate layers. When a voltage is applied between the cathode and anode electrodes to forward bias the device, the two outermost PN junctions, i.e., those nearest the anode and cathode electrodes, become forward-biased, but the center PN junction is reverse-biased so that a high impedance between anode and cathode electrodes is presented by the device until conduction is initiated by an appropriate trigger-signal current applied to the gate or control electrode. If a control current of suitable magnitude and duration is applied, not only does the center PN junction break down to turn on the device and initiate main current conduction between the anode and cathode electrodes, but a very low impedance is presented between the anode and cathode electrodes.

Two requirements which normally must be fulfilled in order to obtain the desired turn-on conduction across the center PN junction of such thyristors are (1) that one of the two transistor analogue sections into which the device is resolvable, i.e., an NPN and a PNP transistor analogue section with the center junction being the collector junction of each of the transistor analogue sections, have a current gain, alpha, which increases with current, and (2) that the sum of the current gains of the two transistor analogue sections be equal to or greater than unity at some intermediate current. The variable current gain requirement is met by characteristics inherent in silicon PN junction structures. The second requirement is fulfilled by the control electrode current applied during turn-on.

Thyristors to which the present invention is particularly applicable are those having relatively high power ratings, e.g., when in the turned-off state they can successfully block high reverse voltages of the order of 1,000 peak reverse volts, and when in the turned-on state they can normally conduct large forward currents of the order of 100 amperes (average). The present invention is also particularly applicable to such thyristors desired to have a capability of operation at high frequencies such as 5,000 turn-on-turn-off cycles per second.

One of the recognized limitations of conventional thyristors available heretofore is their inability to withstand safely very high rates of rise of anode current (the in-rush current slope or *di/dt*) during the turn-on process. It is also recognized in the art that the maximum endurable *di/dt* of such devices decreases with increases in the magnitude of the forward voltage which is blocked, with increasing switching frequency, and with increased gate current sensitivity.

Another limitation of conventional thyristors is their minimum rise time. Rise time, which is one part of the total time required to switch a thyristor from a forward current blocking or turned-off state to a conducting or turned-on state, may be defined as the time that elapses while forward anode-to-cathode current through the thyristor increases from 10 percent to 90 percent of its maximum value. A remaining significant part of the overall turn-on time of such a device is known as delay time ($t_d$). Delay time may be defined as the length of time required, after a triggering signal current applied to the gate electrode of the device reaches 10 percent of its final value, for resulting forward current to reach 10 percent of its maximum value during switching from the turned-off state to the turned-on state.

Another recognized limitation in prior art thyristors is the undesirably high minimum gate or control current required to switch such devices from a forward current blocking state to a conducting state.

One object of the present invention is to provide an improved semiconductor thyristor device which has a control signal responsive portion functionally separate from, though structurally monolithic with, a main current carrying portion, and in which each such portion can be separately optimized.

Another object is to provide an improved monolithic compound thyristor which can be switched from its high impedance or forward-current-blocking state to a low impedance nonblocking or turned-on state by a relatively small control current of the order of 50 milliamperes, yet whose main current conducting capability when in the nonblocking state can have very high values for example of the order of 100 amperes or more.

Another object is to provide improved thyristors of the foregoing character having the capability of blocking relatively large applied forward voltages, of the order of 1,000 volts, yet able reliably to withstand large magnitudes of *di/dt* such as 500 amperes/microsecond when turned on with such large forward voltages applied.

Another object is to provide such a device whose turn-on sensitivity can be varied relatively independently of the amount of power the device is capable of switching.

Another object is to provide such a thyristor which is particularly suitable for connection in parallel circuit relation with other such devices for switching in unison without objectionable current hogging by any one or some of such devices.

Another object is to provide a device of the foregoing character which includes means integrally provided within the device itself for internally amplifying an applied control current or gate current signal to facilitate accelerated turning on of the device responsive thereto.

Still another object is to provide such a device which can withstand, in the absence of a control current, high rates of rise of applied anode voltage, i.e., *dv/dt*, without inadvertently turning on.

Another object is to provide a device of the foregoing character which is relatively economical to manufacture, yet can be switched from the blocking or off-state to the conducting or on-state in a very short time in the order of a few microseconds.

These and other objects of the present invention, and its various advantages, will be more fully appreciated from the following description and the accompanying drawings in which.

Figure 1:
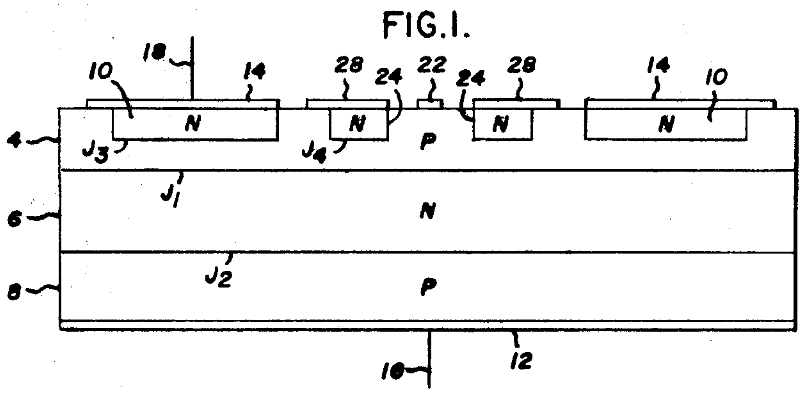
FIG. 1 is a fragmentary sectional elevational view, not to scale, of one form of a semiconductor switching device constructed in accordance with the present invention.

Referring to the drawings, particularly FIG. 1, there is shown a three-terminal semiconductor thyristor device comprising a disclike body 2 of monocrystalline silicon semiconductor material having first and a second layers or regions 4, 8 of P-type conductivity parallel to the major faces of body 2 and separated by an intermediate layer or region 6 of N-type conductivity. PN junctions $J_1$ and $J_2$ are formed at the interfaces of the middle region 6 with the respective first and second regions 4, 8. P region 4 will hereinafter be called the cathode gate, N region 6 the anode gate or base, and P region 8 the anode. A fourth region or cathode 10, of annular shape and N-type conductivity, is inset into the top surface of cathode gate 4 and is separated by a PN junction $J_3$ from the cathode gate 4. An anode electrode 12 makes a low resistance nonrectifying contact substantially on the entire lower or exterior major face of anode 8. An annular cathode electrode 14 makes low resistance nonrectifying contact with the upper face of cathode 10 and extends in short-circuiting relation across the outer periphery of junction $J_3$ into similar low resistance nonrectifying contact with cathode gate 4. Main current carrying conductors, shown schematically by leads 16, 18, are connected to the respective anode and cathode electrodes 12, 14.

The cathode electrode 14 and cathode 10 are shown as generally annular in shape, and spaced radially inward from the inner periphery of cathode electrode 14 and cathode 10 and located preferably centrally on the upper major face of the semiconductor body, is a control or gate electrode 22 which makes nonrectifying low resistance contact with the central portion of the top surface of cathode gate 4.

To form a part of the trigger signal sensitivity-determining portion of the device, there is inset into the top surface of cathode gate a pilot cathode 24 of N-type conductivity which preferably is of annular shape concentric with centerline 26 and gate electrode 22. Pilot cathode 24 makes a PN junction $J_4$ with the adjacent portion of cathode gate 4, and is surmounted by an annular pilot cathode electrode 28 which extends in short-circuiting relation across the entire length of the outer periphery of junction $J_4$, i.e., the periphery of junction $J_4$ nearest to the main cathode 10 and junction $J_3$, and makes nonrectifying low resistance contact with both pilot cathode 24 and cathode gate 4.

The cathode gate region 4 desirably should be thick enough, i.e., deep enough in a direction perpendicular to the major faces of body 2, to permit the application of the nonrectifying contacts 14 and 28 thereto without short-circuiting penetration through to the anode gate 6, and desirably should be deep enough to provide a low impurity concentration gradient to be achieved devices the interface between the cathode gate region 4 and the anode gate region 6 so as to provide a high breakover voltage for the junction $J_1$. The cathode gate region 4 should not be so thick, however, as to unduly increase the resistance of the main current path through it and thereby undesirably raise the forward voltage drop of the completed device. A depth of the cathode gate region 4 of from about 0.002 inch to 0.004 inch has been found satisfactory for devices constructed in accordance with the present invention. The cathode 10 and pilot cathode 24 may desirably have thicknesses of about 0.0005 to 0.001 inch.

The anode gate region 6 must be thick enough to block the desired amount of voltage when the device is in the nonconducting state. The desired thickness of the anode gate region 6 for such voltage blocking capability is, of course, dependent upon the resistivity of the semiconductor material constituting it. A thickness or depth of from 0.006 inch to 0.010 inch has been found satisfactory for the anode gate region 6 of high voltage (e.g., 1,000 volt) devices constructed in accordance with the present invention, whereas such a thickness of about 0.002 to 0.004 inch is sufficient for low voltage (e.g., 200 volt) devices. The thickness of the anode region 8 is usually equal to that of the cathode gate region 4 but is not critical and may be somewhat more or less depending upon design considerations forming no part of the present invention.

In the manufacture of a device such as that shown in FIG. 1, the cathode gate 4 and anode 8 may be formed by diffusion techniques well known to those skilled in the art, wherein for example a suitable P-type doping impurity such as gallium is introduced into a phosphorous-doped N-type single crystal body of silicon semiconductor material having a starting resistivity of about 10 to 200 ohm-centimeters, and converts the surface-adjacent portions thereof to P-type conductivity to a depth of about 2 to 4 mils, with a surface concentration of gallium of about $10^{17}$ to $10^{19}$ atoms per cc.

The cathode 10 and pilot cathode 24 are then formed in the cathode gate region 4 by counterdoping, for example, by diffusion of a suitable N-type doping impurity such as phosphorous into the cathode gate region 4. Conventional photolithograph techniques, using a temporary or permanent masking layer of a suitable masking material such as silicon dioxide, may be used, as is well known to those skilled in the art, to define the locations of cathode 10 and pilot cathode 24. Cathode 10 and pilot cathode 24 may thus be provided, for example, with a thickness of about 0.5 to 1.0 mils and an N-type impurity concentration at the surface of about $10^{20}$ to $10^{21}$ atoms per cc.

Thereafter, the contacts of electrodes 12, 14, 28 and 22 are applied, by any suitable technique such as evaporation. These contacts may consist, for example, of a suitable metallic contact material, for example aluminum, and main current carrying electrodes 12, 14 may be backed as desired by conventional heat sink members of suitable refractory material such as tungsten, molybdenum, or the like (not shown).

A semiconductor thyristor device such as above-described may be suitably mounted on a metallic support which can serve as an appropriate heat sink, and may be protectively enclosed by, for example, a hermetically sealed metal container or plastic encapsulation, all in accordance with techniques well known to those skilled in the art.

Figures 2, 3, 4, 5:
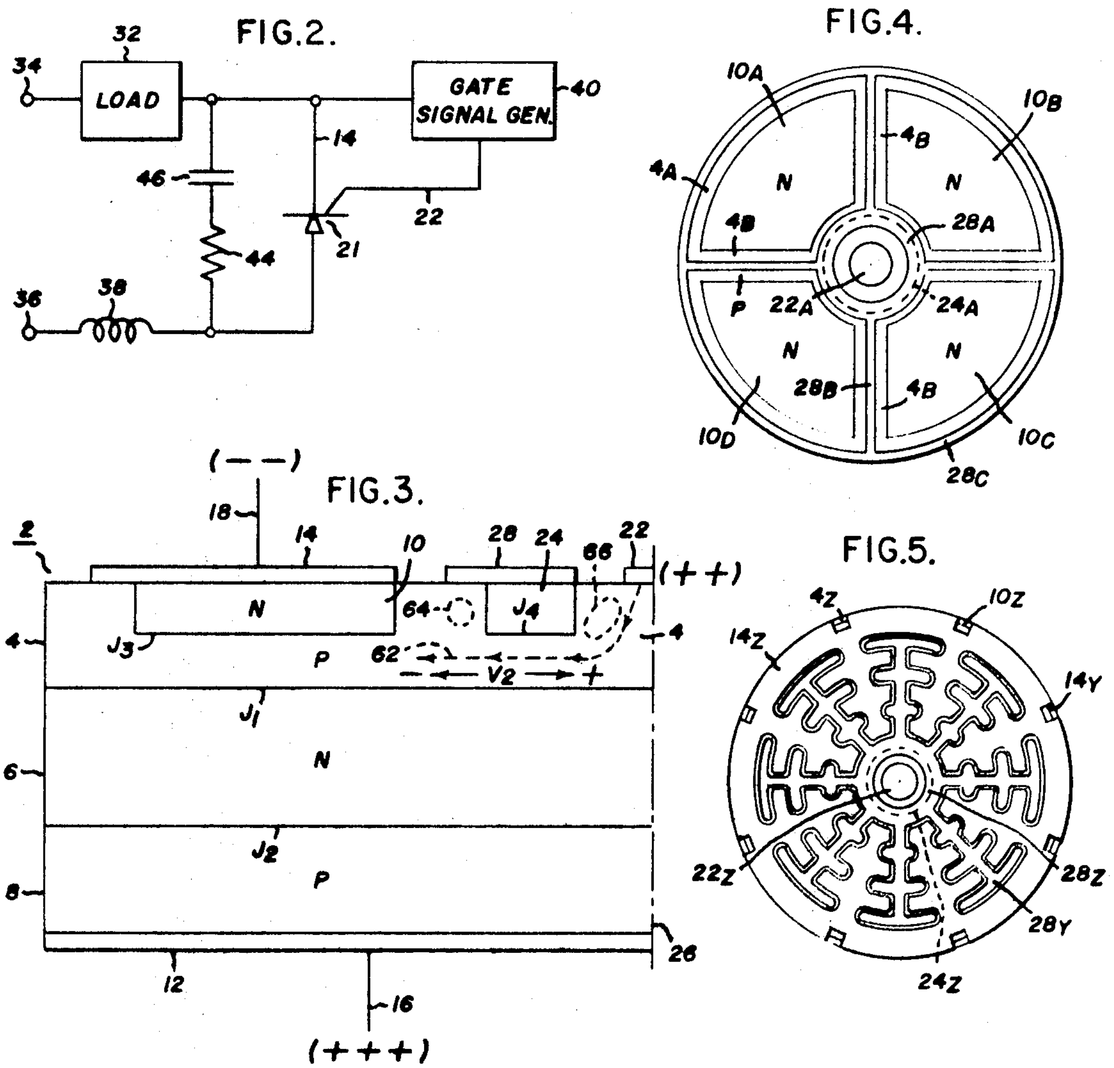
FIG. 2 is a schematic diagram of a thyristor constructed according to the present invention and connected in an electric circuit.
FIG. 3 is a hybrid diagram of a thyristor constructed according to the present invention and showing one stage in the operation thereof.
FIGS. 4 and 5 are fragmentary plan views of semiconductor body portions of alternative embodiments of the present invention.

FIG. 2 is a schematic diagram of a thyristor 21 constructed according to the present invention and connected in series with a load 32 between a pair of power supply terminals 34 and 36. Load *di/dt* limiting means, shown as an inductor 38, is also included in this series circuit. The gate electrode 22 is supplied with a suitable trigger signal, for turning the thyristor on, from a trigger signal generator of any suitable type as indicated by block 40. Trigger signal generator 40 has terminals connected between cathode electrode 14 and the gate electrode 22 and is shown poled for positive gate current, i.e., so that the normal direction of conventional gate current flow is into the cathode 4 gate and out of the cathode 10.

To reduce the maximum rate of rise of forward anode voltage on the thyristor shown in FIG. 2, if desired, it may be shunted by a conventional snubber circuit comprising a resistor 44 and a capacitor 46 in series.

The operation of the above-described thyristor device according to the present invention will now be explained, particularly with respect to FIG. 3, which is a hybrid diagram somewhat similar to FIG. 1. With forward bias applied to the device, e.g., with anode electrode 12 positive with respect to cathode electrode 14, application of a positive gate current to the gate electrode 22 produces a current flow from electrode 22 toward cathode 10. This current flow creates a voltage drop $V_2$ in a direction parallel to junction $J_4$ in the region immediately adjacent junction $J_4$, as shown by dashed line 62. Electrode 28, by extending toward cathode 10 in shorting relation across the outer periphery of junction $J_4$, provides a direct low resistance connection for pilot cathode 24 to a region, as shown at 64, whose potential is lower by the amount of voltage drop $V_2$ than that of region 66 on the gate side of pilot cathode 24. This voltage differential between pilot cathode 24 and region 66 is sufficient to forward bias junction $J_4$. Current flow is thus initiated from that portion of the cathode gate 4 at region 66 immediately adjacent the gate electrode 22 into the pilot cathode region 24. This current flow continues through pilot cathode electrode 28 and thence across forward biased junction $J_4$ into main cathode 10 and on to cathode electrode 14. This in turn produces injection of negative charge carriers from pilot cathode 24 into the portion of cathode gate 4 immediately adjacent pilot cathode 24, and switches to the turned-on state the pilot thyristor portion of the device constituted by the pilot cathode 24 and the portion of the layers 8, 6 and 4 opposite, i.e., below, pilot cathode 24. The resulting current flow from anode electrode 12 through the relatively small area pilot portion of the semiconductor body below the pilot cathode is conducted, by the portion of pilot cathode electrode 28 which overlaps junction $J_4$, into that portion of the cathode gate 4 adjacent main cathode 10. There the pilot current provides an amplified, relatively high energy trigger signal for abruptly initiating main current conduction in the large area portion of the semiconductor body 2 located between the main cathode electrode 14 and the anode electrode 12.

Once the main portion of the thyristor turns on and the trigger signal to gate electrode 22 is terminated, the portion of the semiconductor body 2 beneath pilot cathode 24 is essentially bypassed by main current flow through the portion of the semiconductor body between cathode electrode 14 and anode 12, and essentially no current flows through the central or pilot portion below pilot cathode 24. This means that the center of the semiconductor body is less heated and correspondingly cooler during main current conduction than the central portion of a conventional thyristor which is normally the hottest, and this greatly diminishes the possibility of failure due to overheating of thyristor devices constructed according to the present invention.

Thus it will be evident that by a kind of compound action the gate signal at electrode 22 fires the pilot thyristor portion of the device and the pilot portion in turn fires the monolithically integral main portion. Monolithic compound thyristor devices as above described and constructed in accordance with the present invention have a number of important advantages relative to thyristors of the prior art. First such a device can have a superior turn-on capability, in that it can be turned on responsive to application of a relatively smaller gate or control electrode signal current than heretofore required for devices of comparable main current carrying capacity. Secondly the turn-on sensitivity can be controlled and optimized through design of the pilot region independent of and without affecting the magnitude of main current which can be conducted between the main terminals 14 and 12 when the device is switched on. Further the device has very high *di/dt* capability, meaning that it is capable of withstanding very high rates of rise of anode current during the turn-on process, e.g., 500 amperes per microsecond, without deleterious effect. Additionally, the *di/dt* performance can be obtained without appreciable sacrifice of *dv/dt* performance. Further, as a result of the foregoing characteristics, devices constructed in accordance with the present invention are particularly suitable for connection in parallel with other similar devices without objectionable current hogging or undesirable switching out of unison. Finally, since the pilot portion of the thyristor is centrally located in the semiconductor body its effect is obtained at the expense of utilization of a minimum amount of area of the semiconductor body, leaving substantially all of the remaining area of the disclike semiconductor body surrounding the pilot central portion available for conduction of the main anode-to-cathode current.

FIGS. 4 and 5 show top or plan views of alternative embodiments of the present invention. In FIG. 4, the cathode is divided into a plurality of separated segments 10A, 10B, 10C, and 10D. The gate electrode 22A is identical to gate electrode 22. The pilot cathode 24A is identical to pilot cathode 24. Its outer peripheral boundary is shown by dashed lines. The pilot cathode electrode 28A is generally similar to pilot cathode electrode 28, except that it is provided with a plurality of integrally formed metallic spokes 28B and integrally formed metallic rim 28C. The rim and the spokes are supported by the surface of the cathode gate region 4A, which is generally similar to cathode gate region 4, except for the incorporation of avenues 4B which pass between the segments of the cathode. The operation of the controlled rectifier of FIG. 4 is generally similar to that of the rectifier disclosed in FIGS. 1 through 3 inclusive. The principal advantage of the rectifier of FIG. 4 is that the metal spokes and rim of the pilot cathode electrode allow for greater areal distribution of the output of the pilot thyristor to the main current carrying thyristor.

In FIG. 5, the gate electrode 22Z is identical to gate electrode 22. The pilot cathode 24Z is generally similar to pilot cathode 24; the outer periphery of the pilot cathode 24Z is shown by a dashed line. The pilot cathode electrode 28Z is generally similar to pilot cathode electrode 28, except that it is provided with a plurality of finger portions 28Y. The finger portions are supported by correspondingly shaped surface portions of the cathode gate region. Spaced from the finger portions of the pilot cathode electrode is the cathode electrode 14Z. The cathode electrode 14Z overlies the outer junction periphery of the cathode gate region 4Z and the cathode region 10Z, except in a plurality of peripheral regions in which the cathode electrode is provided with insets 14Y. The controlled rectifier of FIG. 5 operates similarly as those described in the preceding FIGS. The finger portions 28Y function to distribute the current output of the pilot thyristor similarly as the spokes and rim in FIG. 4. The insets in the outer periphery of the cathode electrode serve the added advantage of protecting the controlled rectifier against very high voltage surges that might otherwise damage the surface of the device.

It will be appreciated by those skilled in the art that thyristors may be constructed according to the present invention having all conductivity types and polarities reversed from those shown in the drawings, and the present invention may be applied to either the reversed and unreversed polarity embodiments thereof.

It will be appreciated by those skilled in the art that the invention may be carried out in various ways and may take various forms and embodiments other than the illustrative embodiments heretofore described. For example, it is not essential that the gate and pilot portions of the controlled rectifier be located in the center of the cathode gate region, although this is preferred. I prefer to locate the gate and pilot portions in the center of the device to minimize the temperature of the center of the silicon crystal, since with conventional devices the center of the device is the hottest portion during operation. Additionally, central location of the gate and pilot thyristor portions obviates any necessity of applying a passivant to the junction boundaries, as is essential using a separate pilot thyristor which is not structurally integrated or which is structurally integrated along less than all edges. Still further, by locating the pilot thyristor centrally it occupies a minimum area of the semiconductor crystal.

It is not essential that the cathode electrode provide a short across the junction $J_3$ as shown. Further, instead of the shorting around the entire periphery of the cathode region 10, the cathode electrode may merely short at one or selected number of locations. It is likewise not essential that the pilot cathode electrode overlie the junction $J_4$, although it is desirable that the pilot cathode electrode contact a portion of the cathode gate region surface lying nearer the cathode region than the pilot cathode region. It is not essential that the pilot cathode electrode contact to the surface of the cathode gate region be annular, although this is preferred for greater uniformity of current distribution.

In the embodiment of FIG. 4 the number of spokes 28B may be either increased or decreased. The rim 28C is not essential and may be omitted partially or entirely. In one form the cathode region may be unitary and only one spoke provided to deliver current from the pilot cathode electrode to the rim. In this instance it is apparent that the rim functions similarly as a ring gate. Instead of interrupting the cathode region with streets 4B it is appreciated that the spokes may be raised above or otherwise electrically insulated from the cathode region. In a variant form the spokes may take the form of one or more wires welded between the pilot cathode electrode and the rim. In another variation it is recognized that a plurality of rims may be provided located intermediate the rim 28C and the pilot gate electrode portion 28A and intersecting the spokes. In this instance, of course, annular streets would be provided for each rim, similar to streets 4B. With a single intermediate rim for instance in the arrangement shown in FIG. 4 the cathode region would be divided into eight segments instead of four as shown.

In the arrangement shown in FIG. 5 the number of finger portions may be increased or decreased as desired. The inserts 14Y for the cathode electrode may be increased in number or omitted entirely. Since still other structural variations in structure could be recited, it is to be understood that the scope of the invention is not limited by the details of the foregoing description but will be defined in the following claims:

I claim:

1. A semiconductor switching device which is highly sensitive to gate signals and which is capable of withstanding very high rates of current increase comprising:

a semiconductor body having first, second, third, and fourth contiguous regions of alternate conductivity type forming junctions therebetween, said first region lying along an end surface of said semiconductor body and being laterally divided by said second region adjacent thereto into a central annular segment and a plurality of surrounding principal current carrying segments spaced from said central segment and from each other, first main current carrying electrode means associated with said principal current carrying segments of said first region, second main current carrying electrode means associated with said fourth region, said second region lying along said end surface of said semiconductor body centrally of said annular segment and between said annular segment and said principal current carrying segments, said second region forming a peripheral portion along said end surface surrounding said principal current carrying segments, and said second region including avenues along said end surface between said principal current carrying segments, a pilot electrode overlying said central annular segment of said first region and extending outwardly to overlie said second region between said annular segment and said principal current carrying segments, said pilot electrode including spokes extending outwardly overlying said avenues of said adjacent region and said spokes being joined to a metallic rim and overlying said peripheral portion of said adjacent region, and gate electrode means associated with said second region centrally of said central annular segment.

2. A semiconductor switching device which is highly sensitive to gate signals and which is capable of withstanding very high rates of current increase comprising:

a semiconductor body having first, second, third, and fourth contiguous regions of alternate conductivity type forming junctions therebetween, said first region lying along an end surface of said semiconductor body and being laterally divided by said second region adjacent thereto into a central annular segment and a concentrically arranged, laterally spaced principal current carrying segment, first main current carrying electrode means associated with said principal current carrying segment of said first region, second main current carrying electrode means associated with said fourth region, said second region lying along said end surface of said semiconductor body centrally of said annular segment and between said annular segment and said principal current carrying segment, said second region having finger portions along said end surface extending outwardly toward the periphery of said semiconductor body and said principal current carrying segment extending inwardly along said end surface between said finger portions, a pilot electrode overlying said central annular segment of said first region and extending outwardly to overlie said second region between said annular segment and said principal current carrying segment, said pilot electrode including metallic fingers overlying said finger portions of said second region, and gate means associated with said second region centrally of said central annular segment.

3. A semiconductor switching device according to claim 2 in which said first main electrode means extends laterally beyond said principal current carrying segment of said first region to overlie a portion of said second region lying peripherally beyond said principal current carrying segment and said main electrode means is provided with spaced peripheral insets to leave portions of said principal current carrying segment and said second region free of association with said first main electrode means whereby the semiconductor switching device is protected against very high voltage surges that might otherwise damage the surface of the device.